United States Patent
Salzman et al.

(10) Patent No.: US 7,482,195 B2
(45) Date of Patent: Jan. 27, 2009

(54) HIGH MOBILITY HIGH EFFICIENCY ORGANIC FILMS BASED ON PURE ORGANIC MATERIALS

(75) Inventors: Rhonda F. Salzman, Ann Arbor, MI (US); Stephen R. Forrest, Ann Arbor, MI (US)

(73) Assignee: The Trustees of Princeton University, Princeton, NJ (US)

( * ) Notice: Subject to any disclaimer, the term of this patent is extended or adjusted under 35 U.S.C. 154(b) by 270 days.

(21) Appl. No.: 11/529,367

(22) Filed: Sep. 29, 2006

(65) Prior Publication Data

US 2007/0087449 A1    Apr. 19, 2007

Related U.S. Application Data

(60) Provisional application No. 60/721,975, filed on Sep. 30, 2005.

(51) Int. Cl.
    *H01L 21/00* (2006.01)
(52) U.S. Cl. .............. 438/57; 438/48; 438/65; 438/66; 438/82; 257/40; 257/183; 257/184; 257/461; 436/147
(58) Field of Classification Search .......... 438/57, 438/66, 82
    See application file for complete search history.

(56) References Cited

U.S. PATENT DOCUMENTS

| | | | |
|---|---|---|---|
| 6,333,458 B1 | 12/2001 | Forrest et al. | |
| 6,352,777 B1 | 3/2002 | Bulovic et al. | |
| 6,420,031 B1 | 7/2002 | Parthasarathy et al. | |
| 6,440,769 B2 | 8/2002 | Peumans et al. | |
| 6,451,415 B1 | 9/2002 | Forrest et al. | |
| 6,580,027 B2 | 6/2003 | Forrest et al. | |
| 6,657,378 B2 | 12/2003 | Forrest et al. | |
| 2002/0189666 A1 | 12/2002 | Forrest | |
| 2005/0110007 A1 | 5/2005 | Forrest et al. | |
| 2005/0136232 A1 | 6/2005 | Forrest | |
| 2005/0224113 A1 | 10/2005 | Xue et al. | |

(Continued)

OTHER PUBLICATIONS

Peumans et al., "Efficient photon harvesting at high optical intensities in ultrathin organic double-heterostructure photovoltaic diodes", Appl. Phys. Lett. 76: 2650-2652, 2000.

(Continued)

*Primary Examiner*—N Drew Richards
*Assistant Examiner*—Kyoung Lee
(74) *Attorney, Agent, or Firm*—McDermott Will & Emery LLP

(57) ABSTRACT

A method of purifying small molecule organic material, performed as a series of operations beginning with a first sample of the organic small molecule material. The first step is to purify the organic small molecule material by thermal gradient sublimation. The second step is to test the purity of at least one sample from the purified organic small molecule material by spectroscopy. The third step is to repeat the first through third steps on the purified small molecule material if the spectroscopic testing reveals any peaks exceeding a threshold percentage of a magnitude of a characteristic peak of a target organic small molecule. The steps are performed at least twice. The threshold percentage is at most 10%. Preferably the threshold percentage is 5% and more preferably 2%. The threshold percentage may be selected based on the spectra of past samples that achieved target performance characteristics in finished devices.

23 Claims, 8 Drawing Sheets

U.S. PATENT DOCUMENTS

2005/0266218 A1   12/2005   Peumans et al.
2006/0027802 A1    2/2006   Forrest et al.
2006/0032529 A1    2/2006   Rand et al.
2006/0278944 A1* 12/2006   Rand et al. .................. 257/431

OTHER PUBLICATIONS

Miessler et al., "Inorganic Chemistry", 2nd Edition, Prentice Hall, Chapter 13, 1999.

Tang, "Two-layer organic photovoltaic cell", Appl. Phys. Lett. 48(2): 183-185, 1986.

Yang et al., "Controlled growth of a molecular bulk heterojunction photovoltaic cell", Nature Mater. 4: 37-41, 2005.

Peumans et al., "Very-high-efficiency double-heterostructure cooper phthalocyanine/$C_{60}$ photovoltaic cells", Appl. Phys. Lett. 79(1): 126-128, 2001.

Xue et al., "4.2% efficient organic photovoltaic cells with low series resistances", Appl. Phys. Lett. 84(16): 3013-3015, 2004.

Uchida et al., "Organic small molecule solar cells with a homogeneously mixed copper phthalocyanine: $C_{60}$ active layer". Appl. Phys. Lett. 84(21): 4218-4220, 2004.

Xue et al., "A hybrid planar-mixed molecular heterojunction photovoltaic cell", Adv. Mater. 17(1): 66-71, 2005.

Whitlock et al., "Investigations of materials and device structures for organic semiconductor solar cells", Opt. Eng. 32(8): 1921-1934, 1993.

Wohrle et al., "Investigations of n/p-junction photovoltaic cells of perylenetetracarboxylic acid diimides and phthalocyanines", J. Mater. Chem. 5(11):1819-1829, 1995.

Forrest, "Ultrathin organic films grown by organic molecular beam deposition and related techniques", Chem. Rev. 97: 1793-1896, 1997.

Emery, "The rating of photovoltaic performance", IEEE Transactions on Electron Devices 46(10): 1928-1931, 1999.

Thompson et al., "Synthesis of high-purity phthalocyanines (pc): High intrinsic conductivities in the molecular conductors $H_2(pc)I$ and Ni(pc)I", Inorganic Chemistry 32: 3546-2553, 1993.

T. G. Abdel-Malik et al., "Charge transport in nickel phthalocyanine crystals: I. ohmic and space-charge-limited currents in vacuum ambient", J. Phys. Chem. 10: 63-74, 1977.

Pouchert, The Aldrich Library of FT-IR Spectra, 2$^{nd}$ Ed., Aldrich, Milwaukee, vol. 3, pp. 4181-4184, 1997.

R. D. Gould, "Dependence of the mobility and trap concentration in evaporated copper phthalocyanine thin films on background pressure and evaporation rate", J. Phys D 19: 1785-1790, 1986.

Gill, "Drift mobilities in amorphous charge-transfer complexes of trinitrofluorenone and poly-n-vinylcarbazole", J. Appl. Phys. 43(12): 5033-5040, 1972.

Dunlap et al., "Charge-dipole model for the universal field dependence of mobilities in molecularly doped polymers", Phys. Rev. Lett. 77(3): 542-545, 1996.

Xiao et al., "Organic-field-effect transistors using copper phthalocyanine thin film", Synth. Met. 137: 991-992, 2003.

Kitamura et al., "Time-of-flight measurement of lateral carrier mobility in organic thin films", Japan Journal of Applied Physics 43(4B): 2326-2329, 2004.

Kudo et al., "Evaluation of electrical properties of evaporated thin films of metal-free, copper and lead phthalocyanines by In-Situ field effect measurements", Japan Journal of Applied Physics 36: 6994-6998, 1997.

Wagner et al., "Purification and characterization of phthalocyanines" J. Mater. Sci. 17(10): 2781-2791, 1982.

Salzman et al., "The effects of copper phthalocyanine purity on organic solar cell performance", Organic Electronics, 6(5-6): 242-246, 2005.

International Search Report dated Feb. 26, 2007, Application No. PCT/US2006/038278 filed Sep. 29, 2006.

* cited by examiner

HIGH MOBILITY HIGH EFFICIENCY ORGANIC FILMS BASED ON PURE ORGANIC MATERIALS

RELATED APPLICATIONS

This application claims the benefit of priority of U.S. Provisional Application No. 60/721,975 filed Sep. 30, 2005, the contents of which are incorporated herein by reference.

UNITED STATES GOVERNMENT RIGHTS

This invention was made with government support under Contract No. XAT-5-33636-03 awarded by U.S. Department of Energy, National Renewable Energy Laboratory. The government has certain rights in the invention.

JOINT RESEARCH AGREEMENT

The claimed invention was made by, on behalf of, and/or in connection with one or more of the following parties to a joint university-corporation research agreement: Princeton University, The University of Southern California, and Global Photonic Energy Corporation. The agreement was in effect on and before the date the claimed invention was made, and the claimed invention was made as a result of activities undertaken within the scope of the agreement.

FIELD OF THE INVENTION

The present invention generally relates to organic photosensitive optoelectronic devices. More specifically, it is directed to organic photosensitive optoelectronic devices including at least one highly purified photoconductive material, and a method of purifying the material.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

As used herein, the term "rectifying" denotes, inter alia, that an interface has an asymmetric conduction characteristic, i.e., the interface supports electronic charge transport preferably in one direction. The term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers. As used herein, "top" means furthest away from the substrate, while "bottom" means closest to the substrate. There may be intervening layers, unless it is specified that the first layer is "in physical contact with" the second layer.

When electromagnetic radiation of an appropriate energy is incident upon an organic semiconductor material, a photon can be absorbed to produce an excited molecular state. In organic photoconductive materials, the generated molecular state is generally believed to be an "exciton," i.e., an electron-hole pair in a bound state which is transported as a quasi-particle. An exciton can have an appreciable life-time before geminate recombination ("quenching"), which refers to the original electron and hole recombining with each other (as opposed to recombination with holes or electrons from other pairs). To produce a photocurrent, the electron-hole forming the exciton are typically separated at a rectifying junction.

In the case of photosensitive devices, the rectifying junction is referred to as a photovoltaic heterojunction. Types of organic photovoltaic heterojunctions include a donor-acceptor heterojunction formed at an interface of a donor material and an acceptor material, and a Schottky-barrier heterojunction formed at the interface of a photoconductive material and a metal.

FIG. 1 is an energy-level diagram illustrating an example donor-acceptor heterojunction. In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material.

As used herein, a first HOMO or LUMO energy level is "greater than" or "higher than" a second HOMO or LUMO energy level if the first energy level is closer to the vacuum energy level 10. A higher HOMO energy level corresponds to an ionization potential ("IP") having a smaller absolute energy relative to a vacuum level. Similarly, a higher LUMO energy level corresponds to an electron affinity ("EA") having a smaller absolute energy relative to vacuum level. On a conventional energy level diagram, with the vacuum level at the top, the LUMO energy level of a material is higher than the HOMO energy level of the same material.

After absorption of a photon 6 in the donor 152 or the acceptor 154 creates an exciton 8, the exciton 8 disassociates at the rectifying interface. The donor 152 transports the hole (open circle) and the acceptor 154 transports the electron (dark circle).

A significant property in organic semiconductors is carrier mobility. Mobility measures the ease with which a charge carrier can move through a conducting material in response to an electric field. In the context of organic photosensitive devices, a material that conducts preferentially by electrons due to a high electron mobility may be referred to as an electron transport material. A material that conducts preferentially by holes due to a high hole mobility may be referred to as a hole transport material. A layer that conducts preferentially by electrons, due to mobility and/or position in the device, may be referred to as an electron transport layer ("ETL"). A layer that conducts preferentially by holes, due to mobility and/or position in the device, may be referred to as a hole transport layer ("HTL"). Preferably, but not necessarily, an acceptor material is an electron transport material and a donor material is a hole transport material.

How to pair two organic photoconductive materials to serve as a donor and an acceptor in a photovoltaic heterojunction based upon carrier mobilities and relative HOMO and LUMO levels is well known in the art, and is not addressed here.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

For additional background explanation and description of the state of the art for organic photosensitive devices, including their general construction, characteristics, materials, and features, U.S. Pat. No. 6,657,378 to Forrest et al., U.S. Pat. No. 6,580,027 to Forrest et al., and U.S. Pat. No. 6,352,777 to Bulovic et al. are incorporated herein by reference.

SUMMARY OF THE INVENTION

Methods according to embodiments of the present invention include performing a series of operations, beginning with a first sample of an organic small molecule material. The first step is to purify the organic small molecule material by thermal gradient sublimation. The second step is to test the purity of at least one sample from the purified organic small molecule material by spectroscopy. The third step is to repeat the first through third steps on the purified small molecule material if the spectroscopic testing reveals any peaks exceeding a threshold percentage of a magnitude of a characteristic peak of a target organic small molecule. The steps are performed at least twice. The threshold percentage is at most 10%. Preferably the threshold percentage is 5% and more preferably 2%. The threshold percentage may be selected, among other ways, based on the spectra of past samples that achieved target performance characteristics in finished devices.

After no peaks remain that exceed the threshold percentage of the magnitude of the characteristic peak of the target small molecule, the resulting purified material may be used as a component of a photosensitive optoelectronic device. If the device includes a heterojunction based on donor-acceptor principles, a donor or an acceptor of a donor-acceptor interface in the device is constructed to include purified organic small molecule material from the first sample. If the device includes a heterojunction based on Schottky-barrier principles, purified material from the first sample may be used as the photoconductive material portion of the Schottky-barrier heterojunction.

Based on a cumulative repetition of the first through third steps, a determination can be made as to a total amount of thermal gradient sublimation that was required to purify the first sample. This determination of the total amount of sublimation to meet the threshold can then be used as basis for purifying a second sample of the organic small molecule material by thermal gradient sublimation. Purified organic small molecule material from the second sample may be used as the donor or acceptor in a photosensitive optoelectronic device comprising at least one donor-acceptor interface arranged between two electrodes. Purified organic small molecule material from the second sample may also be used as the photoconductive material in a photosensitive device comprising a Schottky-barrier heterojunction.

If the first sample and the second sample are obtained from the same source, the second sample can be purified based upon the results from cycling the first sample with a reasonable degree of predictability that the results from the sublimation of the second sample will mirror the results from the first sample. However, if sources are different, or the samples have been exposed to different conditions (e.g., environmental, storage time), additional testing may be needed to determine that the results from the cycling of the first sample will be pertinent to the second sample.

To test whether the results from the first sample will be applicable to the second sample, additional steps are added to the method. An additional step prior to a first occurrence of "first step" (i.e., sublimation) is to determine an initial spectra of the first sample by spectroscopy. Another additional step or steps is to determine, based on a cumulative repetition of the first through third steps on the first sample (i.e., the cumulative sublimation cycle), a total amount of thermal gradient sublimation that is required to purify the first sample. Spectroscopy is used to determine an initial spectra of a second sample of the organic small molecule material, using a same testing methodology as was used to determine the initial spectra of the first sample. If the initial spectra of second sample substantially matches the initial spectra of the first sample, the a second sample of the organic small molecule material can reliably be purified by thermal gradient sublimation in accordance with the total amount of sublimation needed, as discerned from the cycling of the first sample.

Examples of spectroscopy methods that can be used include mass spectroscopy and Fourier transform infrared (FTIR) spectroscopy. Preferably, both methods are employed during each cycling of the first sample, with the cycle being repeated if either testing methodology reveals peaks that fail to satisfy the threshold percentage requirements. However, either test can be used without the other. Moreover, each testing cycle may include the testing of multiple samples to better assure accuracy.

For mass spectroscopy testing, testing may include making a powder from a sample of the purified organic small molecule material and then performing mass spectroscopy on the powder. A preferred method of mass spectroscopy testing is laser desorption ionization time-of-flight measurement.

For FTIR spectroscopy testing, testing may include depositing a sample of the purified organic small molecule material onto a substrate as a film and then performing FTIR spectroscopy on the film.

The device structure figures are not necessarily drawn to scale.

DETAILED DESCRIPTION

Figure 1:
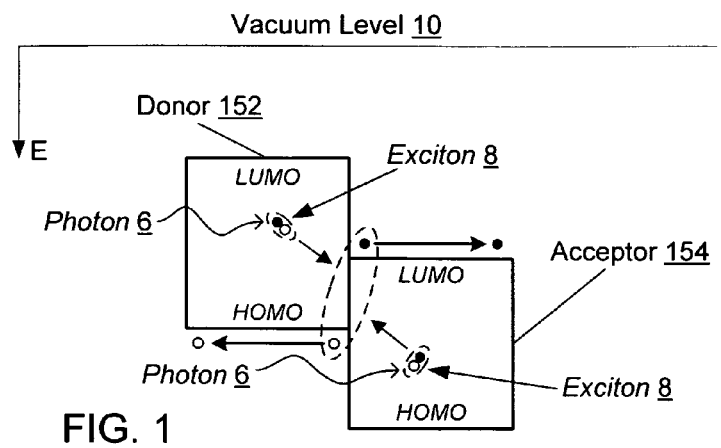
FIG. 1 is an energy level diagram illustrating a donor-acceptor heterojunction.
Figure 2:
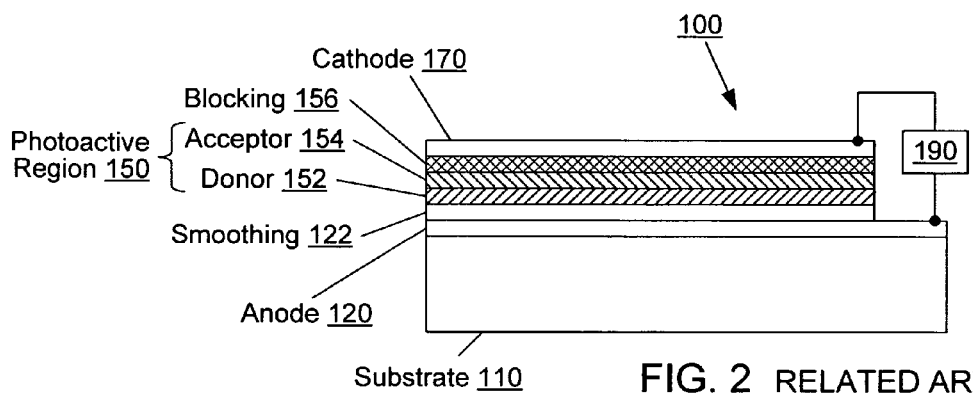
FIG. 2 illustrates an organic photosensitive device including a donor-acceptor heterojunction.

An organic photosensitive device comprises at least one photoactive region in which light is absorbed to form an exciton, which may subsequently dissociate into an electron and a hole. FIG. 2 shows an example of an organic photosensitive optoelectronic device 100 in which the photoactive region 150 comprises a donor-acceptor heterojunction. The "photoactive region" is a portion of a photosensitive device that absorbs electromagnetic radiation to generate excitons that may dissociate in order to generate an electrical current. Device 100 comprises an anode 120, an anode smoothing layer 122, a donor 152, an acceptor 154, an exciton blocking layer ("EBL") 156, and a cathode 170, over a substrate 110.

Examples of EBL 156 are described in U.S. Pat. No. 6,451,415 to Forrest et al., which is incorporated herein by reference for its disclosure related to EBLs. Additional background explanation of EBLs may also be found in Peumans et al., "Efficient photon harvesting at high optical intensities in ultrathin organic double-heterostructure photovoltaic diodes," *Applied Physics Letters* 76, 2650-52 (2000). EBLs reduce quenching by preventing excitons from migrating out of the donor and/or acceptor materials.

The terms "electrode" and "contact" are used interchangeably herein to refer to a layer that provides a medium for delivering photo-generated current to an external circuit or providing a bias current or voltage to the device. As illustrated in FIG. 2, anode 120 and cathode 170 are examples. Electrodes may be composed of metals or "metal substitutes." Herein the term "metal" is used to embrace both materials composed of an elementally pure metal, and also metal alloys which are materials composed of two or more elementally pure metals. The term "metal substitute" refers to a material that is not a metal within the normal definition, but which has the metal-like properties such as conductivity, such as doped wide-bandgap semiconductors, degenerate semiconductors, conducting oxides, and conductive polymers. Electrodes may comprise a single layer or multiple layers (a "compound" electrode), may be transparent, semi-transparent, or opaque. Examples of electrodes and electrode materials include those disclosed in U.S. Pat. No. 6,352,777 to Bulovic et al., and U.S. Pat. No. 6,420,031, to Parthasarathy, et al., each incorporated herein by reference for disclosure of these respective features. As used herein, a layer is said to be "transparent" if it transmits at least 50% of the ambient electromagnetic radiation in a relevant wavelength.

The substrate 110 may be any suitable substrate that provides desired structural properties. The substrate may be flexible or rigid, planar or non-planar. The substrate may be transparent, translucent or opaque. Rigid plastics and glass are examples of preferred rigid substrate materials. Flexible plastics and metal foils are examples of preferred flexible substrate materials.

An anode-smoothing layer 122 may be situated between the anode layer 120 and the donor layer 152. Anode-smoothing layers are described in U.S. Pat. No. 6,657,378 to Forrest et al., incorporated herein by reference for its disclosure related to this feature.

In FIG. 2, the photoactive region 150 comprises the donor material 152 and the acceptor material 154. Organic materials for use in the photoactive region may include organometallic compounds, including cyclometallated organometallic compounds. The term "organometallic" as used herein is as generally understood by one of ordinary skill in the art and as given, for example, in Chapter 13 of "Inorganic Chemistry" (2nd Edition) by Gary L. Miessler and Donald A. Tarr, Prentice Hall (1999).

Organic layers may be fabricated using vacuum deposition, spin coating, organic vapor-phase deposition, inkjet printing and other methods known in the art.

Figure 3:
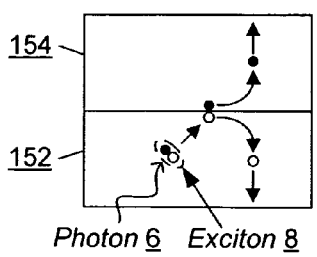
FIG. 3 illustrates a donor-acceptor bilayer forming a planar heterojunction.
Figure 4:
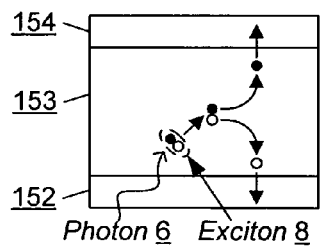
FIG. 4 illustrates a hybrid heterojunction including a mixed heterojunction between a donor layer and an acceptor layer.
Figure 5:
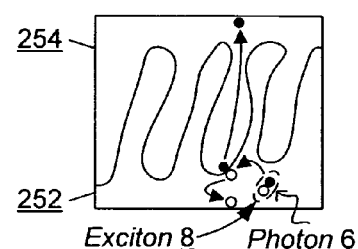
FIG. 5 illustrates a bulk heterojunction.

Examples of various types of donor-acceptor heterojunctions are shown in FIGS. 3-5. FIG. 3 illustrates a donor-acceptor bilayer forming a planar heterojunction. FIG. 4 illustrates a hybrid heterojunction including a mixed heterojunction 153 comprising a mixture of donor and acceptor materials. FIG. 5 illustrates an idealized "bulk" heterojunction. A bulk heterojunction, in the ideal photocurrent case, has a single continuous interface between the donor material 252 and the acceptor material 254, although multiple interfaces typically exist in actual devices. Mixed and bulk heterojunctions can have multiple donor-acceptor interfaces as a result of having plural domains of material. Domains that are surrounded by the opposite-type material (e.g., a domain of donor material surrounded by acceptor material) may be electrically isolated, such that these domains do not contribute to photocurrent. Other domains may be connected by percolation pathways (continuous photocurrent pathways), such that these other domains may contribute to photocurrent. The distinction between a mixed and a bulk heterojunction lies in degrees of phase separation between donor and acceptor materials. In a mixed heterojunction, there is very little or no phase separation (the domains are very small, e.g., less than a few nanometers), whereas in a bulk heterojunction, there is significant phase separation (e.g., forming domains with sizes of a few nanometers to 100 nm).

Small-molecule mixed heterojunctions may be formed, for example, by co-deposition of the donor and acceptor materials using vacuum deposition or vapor deposition. Small-molecule bulk heterojunctions may be formed, for example, by controlled growth, co-deposition with post-deposition annealing, or solution processing. Polymer mixed or bulk heterojunctions may be formed, for example, by solution processing of polymer blends of donor and acceptor materials.

If a photoactive region includes a mixed layer (153) or bulk layers (252, 254) and one or both of the donor (152) and acceptor layers (154), the photoactive region is said to include a "hybrid" heterojunction. The arrangement of layers in FIG. 4 is an example. For additional explanation of hybrid heterojunctions, U.S. patent application Ser. No. 10/910,371 entitled "High efficiency organic photovoltaic cells employing hybridized mixed-planar heterojunctions" by Jiangeng Xue et al., filed Aug. 4, 2004, is hereby incorporated by reference (published Oct. 13, 2005 as U.S. Patent Application Publication 2005-0224113 A1).

In general, planar heterojunctions have good carrier conduction, but poor exciton dissociation; a mixed layer has poor carrier conduction and good exciton dissociation, and a bulk heterojunction has good carrier conduction and good exciton dissociation, but may experience charge build-up at the end of the material "cul-de-sacs," lowering efficiency. Unless otherwise stated, planar, mixed, bulk, and hybrid heterojunctions may be used interchangeably as donor-acceptor heterojunctions throughout the embodiments disclosed herein.

Figure 6:
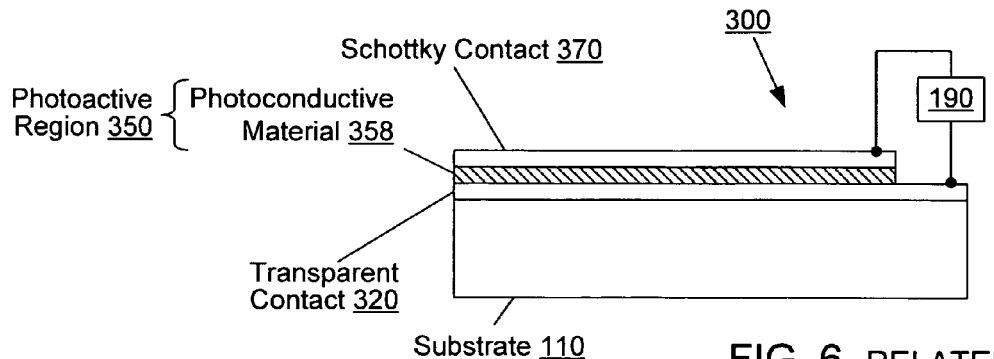
FIG. 6 illustrates an organic photosensitive device including a Schottky-barrier heterojunction.

FIG. 6 shows an example of a organic photosensitive optoelectronic device 300 in which the photoactive region 350 is part of a Schottky-barrier heterojunction. Device 300 comprises a transparent contact 320, a photoactive region 350 comprising an organic photoconductive material 358, and a Schottky contact 370. The Schottky contact 370 is typically formed as a metal layer. If the photoconductive layer 358 is an ETL, a high work function metal such as gold may be used, whereas if the photoconductive layer is an HTL, a low work function metal such as aluminum, magnesium, or indium may be used. In a Schottky-barrier cell, a built-in electric field associated with the Schottky barrier pulls the electron and hole in an exciton apart. Generally, this field-assisted exciton dissociation is not as efficient as the disassociation at a donor-acceptor interface.

The devices as illustrated may be connected to an element 190. If the device is a photovoltaic device, element 190 is a resistive load which consumes or stores power. If the device is a photodetector, element 190 is a current detecting circuit which measures the current generated when the photodetector is exposed to light, and which may apply a bias to the device (as described for example in Published U.S. Patent Application 2005-0110007 A1, published May 26, 2005 to Forrest et al.). If the rectifying junction is eliminated from the device (e.g., using a single photoconductive material as the photoactive region), the resulting structures may be used as a photoconductor cell, in which case the element 190 is a signal detection circuit to monitor changes in resistance across the device due to the absorption of light. Unless otherwise stated, each of these arrangements and modifications may be used for the devices in each of the drawings and embodiments disclosed herein.

An organic photosensitive optoelectronic device may also comprise transparent charge transfer layers, electrodes, or charge recombination zones. A charge transfer layer may be organic or inorganic, and may or may not be photoconductively active. A charge transfer layer is similar to an electrode, but does not have an electrical connection external to the device and only delivers charge carriers from one subsection of an optoelectronic device to the adjacent subsection. A charge recombination zone is similar to a charge transfer layer, but allows for the recombination of electrons and holes between adjacent subsections of an optoelectronic device. A charge recombination zone may include semi-transparent metal or metal substitute recombination centers comprising nanoclusters, nanoparticles, and/or nanorods, as described for example in U.S. Pat. No. 6,657,378 to Forrest et al.; U.S. patent application Ser. No. 10/915,410 entitled "Organic Photosensitive Devices" by Rand et al., filed Aug. 11, 2004 (published Feb. 16, 2006 as U.S. Patent Application Publication US 2006-0032529 A1); and U.S. patent application Ser. No. 10/979,145 entitled "Stacked Organic Photosensitive Devices" by Forrest et al., filed Nov. 3, 2004 (published Feb. 9, 2006 as U.S. Patent Application Publication US 2006-0027802 A1); each incorporated herein by reference for its disclosure of recombination zone materials and structures. A charge recombination zone may or may not include a transparent matrix layer in which the recombination centers are embedded. A charge transfer layer, electrode, or charge recombination zone may serve as a cathode and/or an anode of subsections of the optoelectronic device. An electrode or charge transfer layer may serve as a Schottky contact.

Figure 7:
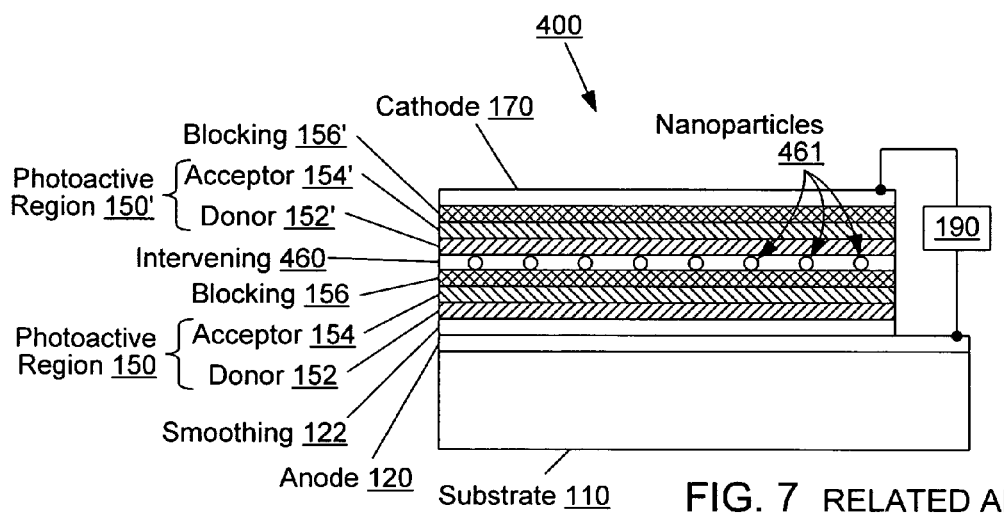
FIG. 7 illustrates tandem photosensitive cells in series.
Figure 8:
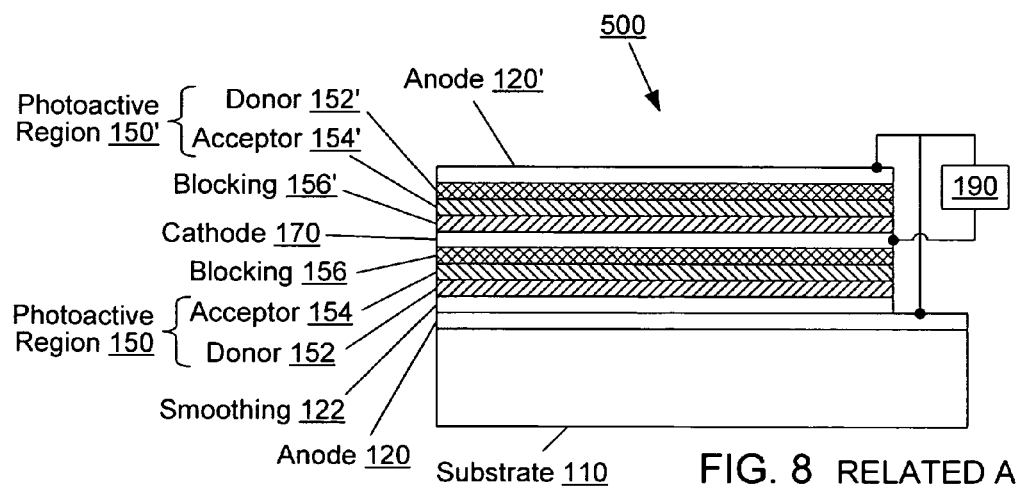
FIG. 8 illustrates tandem photosensitive cells in parallel.

FIGS. 7 and 8 illustrate examples of tandem devices including such transparent charge transfer layers, electrodes, and charge recombination zones. In device 400 in FIG. 7, photoactive regions 150 and 150' are stacked electrically in series with an intervening conductive region 460. As illustrated without external electrical connections, intervening conductive region 460 may be a charge recombination zone or may be a charge transfer layer. As a recombination zone, region 460 comprises recombination centers 461 with or without a transparent matrix layer. If there is no matrix layer, the arrangement of material forming the zone may not be continuous across the region 460. Device 500 in FIG. 8 illustrates photoactive regions 150 and 150' stacked electrically in parallel, with the top cell being in an inverted configuration (i.e., cathode-down). In each of FIGS. 7 and 8, the photoactive regions 150 and 150' and blocking layers 156 and 156' may be formed out of the same respective materials, or different materials, depending upon the application. Likewise, photoactive regions 150 and 150' may be a same type (i.e., planar, mixed, bulk, hybrid) of heterojunction, or may be of different types.

In each of the devices described above, layers may be omitted, such as the exciton blocking layers. Other layers may be added, such as reflective layers or additional photoactive regions. The order of layers may be altered or inverted. A concentrator or trapping configuration may be employed to increase efficiency, as disclosed, for example in U.S. Pat. No. 6,333,458 to Forrest et al. and U.S. Pat. No. 6,440,769 to Peumans et al., which are incorporated herein by reference. Coatings may be used to focus optical energy into desired regions of a device, as disclosed, for example in U.S. patent application Ser. No. 10/857,747 entitled "Aperiodic dielectric multilayer stack" by Peumans et al., filed Jun. 1, 2004 (published Dec. 1, 2005 as U.S. Patent Application Publication US 2005-0266218 A1), which is incorporated herein by reference. In the tandem devices, transparent insulative layers may be formed between cells, with the electrical connection between the cells being provided via electrodes. Also in the tandem devices, one or more of the photoactive regions may be a Schottky-barrier heterojunction instead of a donor-acceptor heterojunction. Arrangements other than those specifically described may be used.

Photovoltaic devices produce a photo-generated current when they are connected across a load and are irradiated by light. When irradiated under infinite load, a photovoltaic device generates its maximum possible voltage, V open-circuit, or $V_{OC}$. When irradiated with its electrical contacts shorted, a photovoltaic device generates its maximum possible current, I short-circuit, or $I_{SC}$. When actually used to generate power, a photovoltaic device is connected to a finite resistive load and the power output is given by the product of the current and voltage, I×V. The maximum total power generated by a photovoltaic device is inherently incapable of exceeding the product, $I_{SC} \times V_{OC}$. When the load value is optimized for maximum power extraction, the current and voltage have the values, $I_{max}$ and $V_{max}$, respectively.

A figure of merit for photovoltaic devices is the fill factor, ff, defined as:

$$ff = \{I_{max}V_{max}\}/\{I_{SC}V_{OC}\}$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, p, may be calculated by:

$$p = ff^*(I_{SC}^*V_{OC})/P_{inc}$$

Organic photovoltaic cells have many potential advantages when compared to traditional silicon-based devices. Organic photovoltaic cells are light weight, economical in materials use, and can be deposited on low cost substrates, such as flexible plastic foils. However, some organic photovoltaic devices typically have relatively low external quantum efficiency, being on the order of 1% or less. This is, in part, thought to be due to the second order nature of the intrinsic photoconductive process. That is, carrier generation requires exciton generation, diffusion and ionization or collection. There is an efficiency associated with each of these processes. Subscripts may be used as follows: P for power efficiency, EQE for external quantum efficiency, A for photon absorption, ED for exciton diffusion, CC for charge collection, and INT for internal quantum efficiency. Using this notation:

$$\eta_P \sim \eta_{EQE} = \eta_A{}^*\eta_{ED}{}^*\eta_{CC}$$

$$\eta_{EQE} = \eta_A{}^*\eta_{INT}$$

Previous investigations revealed that purification of the organic semiconductors used to construct photosensitive devices can improve device performance. However, the predictability of device performance relative to the degree of purification has largely been a process of trial-and-error, whereby there has been a lack of certainty as to how an individual device would perform in advance. When mass-producing devices to particular specification, this degree of uncertainty reduces manufacturing yields, as some run may fall short of a targeted performance.

As disclosed herein, spectroscopic methods are introduced to characterize the purity of organic materials during processing and prior to device fabrication.

In general, the purity of organic semiconductors currently in use tends to be less than ideal. In addition to original atomic and molecular impurities that may be present in the materials when shipped from the manufacturer, additional impurities are often introduced by molecular decomposition and environmental factors. Factors such as ambient temperatures during shipping and storage of bulk materials can therefore impact production yields of finished devices. Moreover, even assuming that all shipments of a particular material are obtained from a same manufacturer at a same time, different production runs can have different trace impurities.

Figure 9:
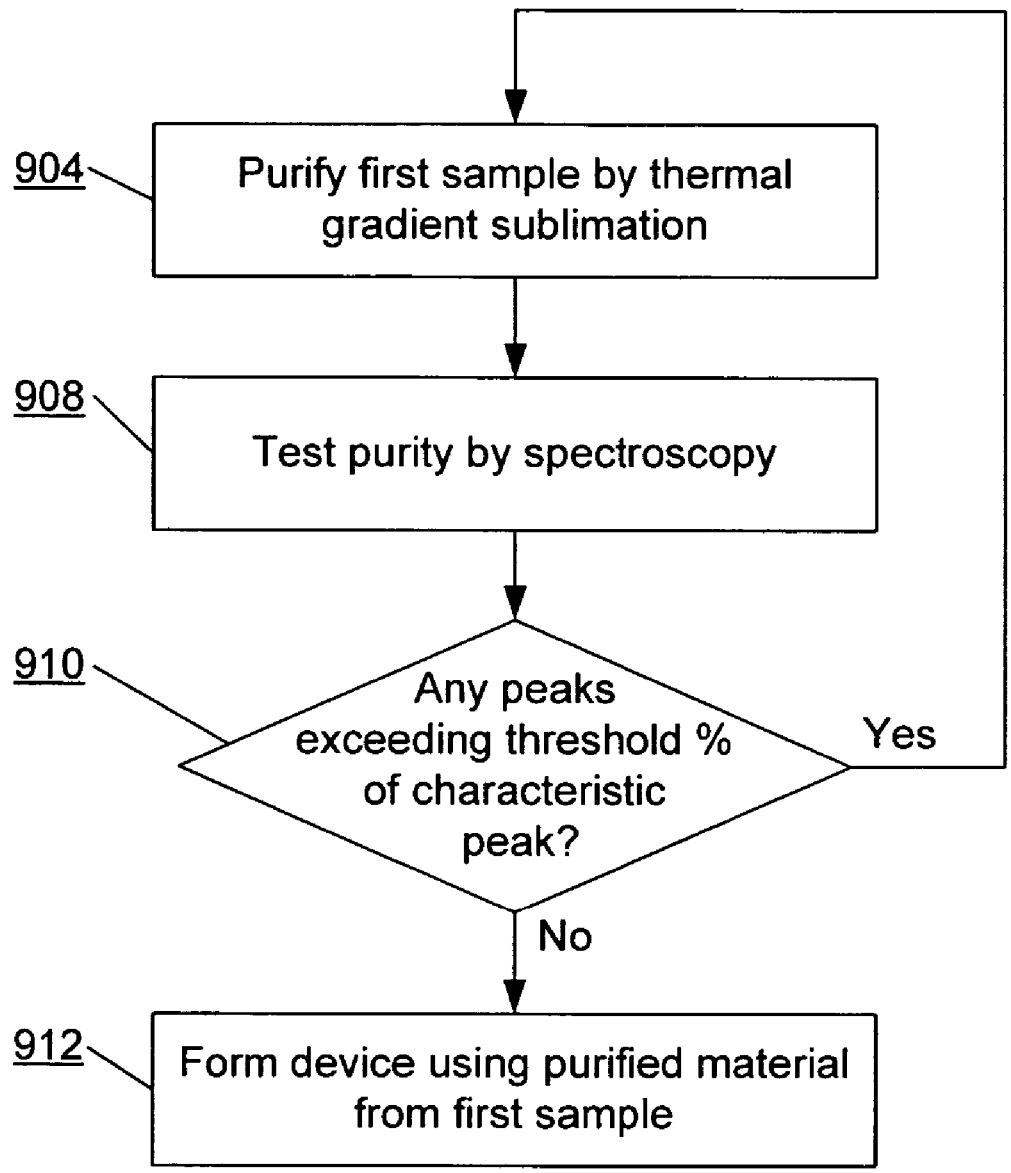
FIG. 9 illustrates a method for purifying a small molecule material sample in accordance with embodiments of the present invention, and the formation of photosensitive optoelectronic device including the pure material formed by the method.

FIG. 9 illustrates a method which introduces spectroscopy into the purification process to achieve reproducible purity benchmarks. A sample of an organic small molecule material is purified (904) by thermal gradient sublimation. A portion of the sample is then tested (908) for purity by spectroscopy. The results of the spectroscopic testing are then checked (910) against a relative threshold percentage of a magnitude of a characteristic peak of the target (desired) molecule. The process then repeats at least once, repeating until the secondary peaks are all below the threshold percentage.

In the resulting purified material, spectroscopic testing will reveal a dominant peak corresponding to the target bulk molecule. However, the initial sample may include multiple large-magnitude peaks (e.g., peaks due to vestigial traces of solvents used during manufacturing), making it difficult to discern the peak corresponding to a target molecule. The position of the peak corresponding to the target molecule is usually known. However, if it is unknown, it can be discerned by process-of-elimination after repeated sublimation cycles.

Prior time-based purification method based on past device performance results are generally unreliable due to variance between bulk sources, and over-purification raises production costs. The method in FIG. 9 has several advantages over such prior methods. First, threshold benchmarks are consistently achieved for purity. Second, these benchmarks can be achieved with the absolute minimum of sublimation needed for a given bulk sample.

Once the benchmarks are achieved, a photosensitive optoelectronic device can be fabricated (912) as described above with FIGS. 2-8, using the purified material as a component in the photoactive region (e.g., 150. 150', 350). In a donor-acceptor device, preferably both the donor and the acceptor are purified.

Based on extrapolation from experimental data, the threshold percentage should be no more than 10% to achieve appreciable improvement in device efficiency and mobility. Preferably, the threshold percentage is selected based on the spectra of a past sample that achieved desired performance characteristics in a finished device. For devices having very thin films (e.g., films that are only a few molecules thick), where the thinness of the film makes the absorption efficiency and carrier mobility especially important, the threshold percentage is preferably no more than 5%, and more preferably 2%.

Figure 10:
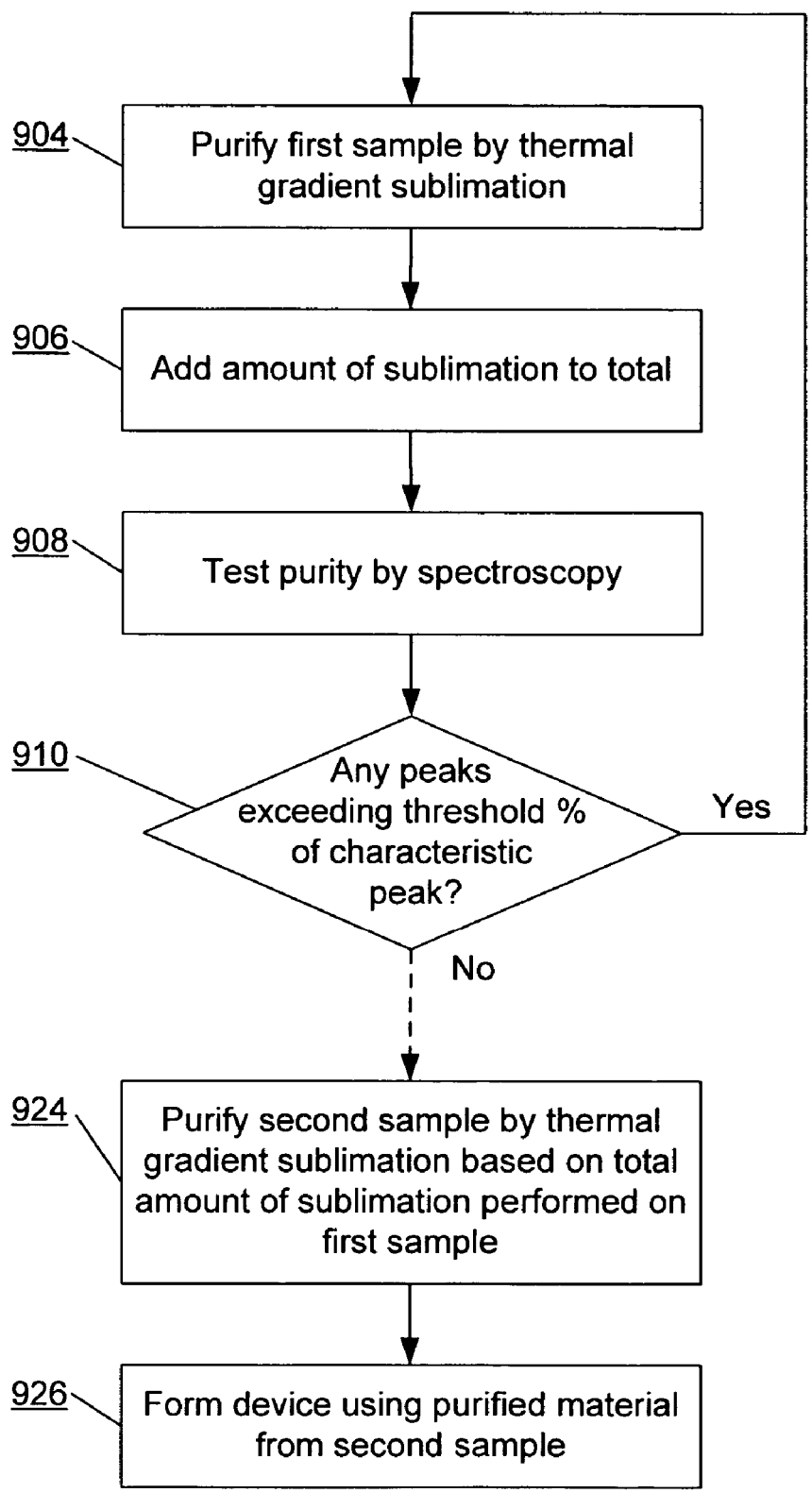
FIG. 10 illustrates a method for purifying a second sample of the small molecule material sample using data discerned by performing the method in FIG. 9.

FIG. 10 expands upon the method of FIG. 9 to purify additional samples of the bulk material based on the cumulative repetition of sublimations performed on the first sample. A step (908) is added to the purification cycle to track the cumulative amount of sublimation needed to purify the first sample. A second sample can then be purified (924) without testing, based upon the total amount of sublimation that was needed for the first sample. A device may then be fabricated (926) using purified material from the second sample, as was referred to above for the first sample (912).

The method in FIG. 10 is especially advantageous when separately processing different samples from a same bulk source relatively soon after purifying the first sample. However, for the reasons described above, if it is not known with reasonable certainty that the impurity characteristics of the first and second samples are about the same, the results from steps 924 and 926 may be unreliable.

Figure 11:
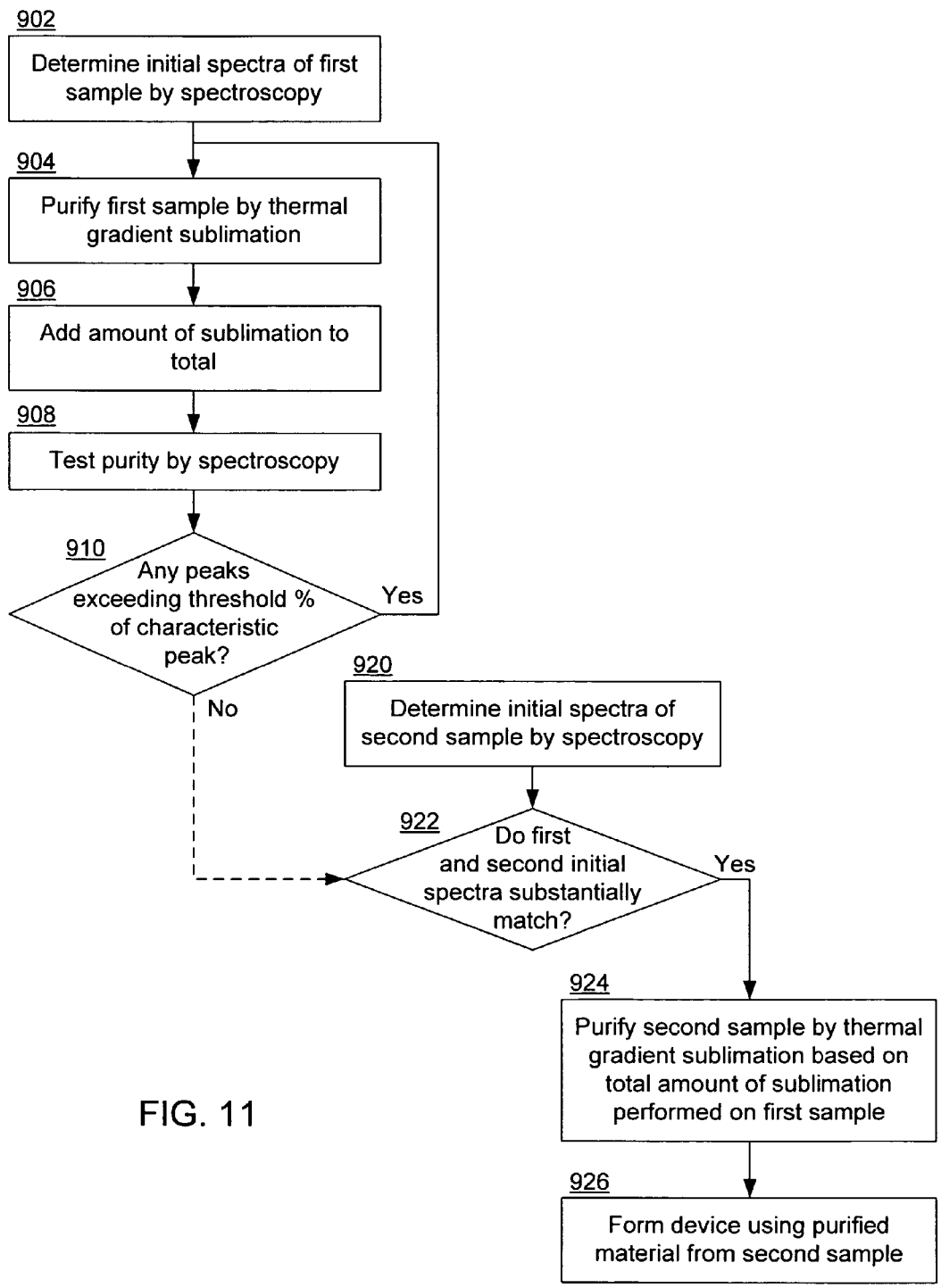
FIG. 11 illustrates a method expanding upon the method illustrated in FIG. 10, including testing to determine whether the results from the method in FIG. 9 are applicable to the second sample.
Figure 12:
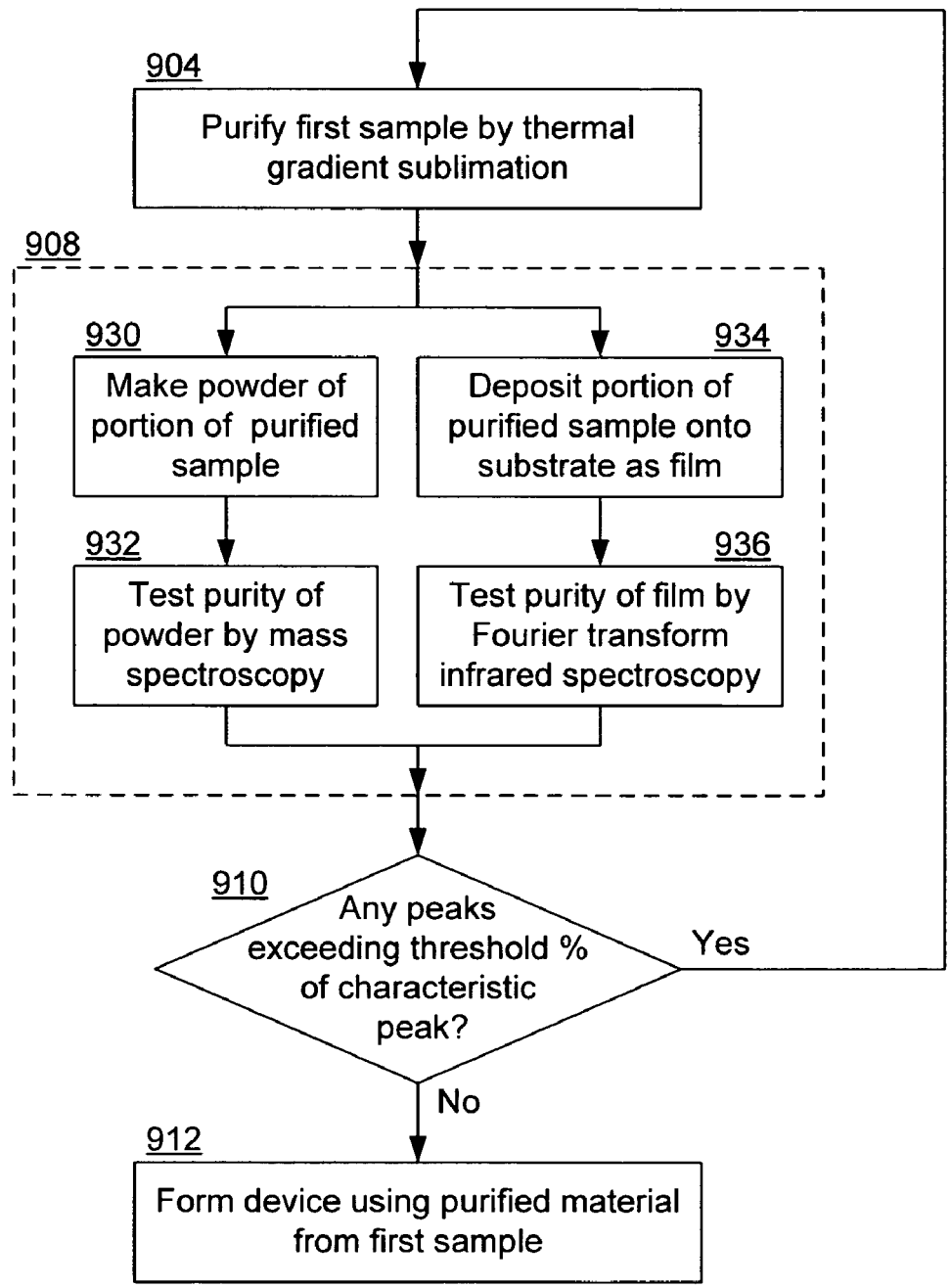
FIG. 12 expands upon the spectroscopic testing methodology employed in the methods in FIGS. 9-11.

The method of FIG. 11 addresses the shortcomings of the method in FIG. 10 when it is not known whether the characteristics of the first and second sample are about the same. In FIG. 11, prior to sublimating the first sample, a benchmark is taken by determining (902) the initial spectra of the sample. When a second sample is to be processed, the initial spectra of the second sample is determined (920) and compared (922) with the initial spectra from the first sample. If the samples are substantially the same, the second sample can reliably be sublimated (924) in accordance with the total amount of sublimation that was needed for the first sample. As can be inferred from this method, initial spectra and sublimation totals can be stored for a plurality of samples, with the sublimation total of the initial spectra that most closely matches the spectra of the second sample (920) being used to control sublimation (924).

FIG. 10 elaborates upon the preferred spectroscopic methods for testing (908). Two preferred methods are mass spectroscopy and Fourier transform infrared (FTIR) spectroscopy. Preferably, both methods are employed during each cycling of the first sample, with the cycle being repeated if either testing methodology reveals peaks that fail to satisfy the threshold percentage requirements. However, either test can be used without the other. Moreover, each testing cycle may include the testing of multiple samples to better assure accuracy.

For mass spectroscopy testing, testing may include making a powder (930) from a sample of the purified organic small molecule material and then performing mass spectroscopy on the powder (932). A preferred method of mass spectroscopy testing is laser desorption ionization time-of-flight measurement.

For FTIR spectroscopy testing, testing may include depositing a sample of the purified organic small molecule material onto a substrate as a film (934) and then performing FTIR spectroscopy on the film (936).

Experimental Results

As described below, the performance of small-molecular weight organic double heterojunction donor-acceptor bilayer solar cells was studied as a function of the purity of the donor material, copper phthalocyanine (CuPc). A finding of this study was that the power conversion efficiency under simulated AM1.5G, 1 sun illumination conditions increases from $(0.26\pm0.01)\%$ to $(1.4\pm0.1)\%$ as the CuPc layer purity increases. Concomitant with the improvements in power conversion efficiency, it was found that the hole mobility of the unpurified CuPc is nearly three orders of magnitude lower than for purified source material. Mass spectrometry and Fourier transform infrared spectroscopy were used to identify metal-free phthalocyanine as the primary impurity that degrades both device efficiency and hole mobility.

Small molecular weight organic semiconductors have been recognized for their potential use in large-area, flexible, and low-cost photovoltaic applications since C. W. Tang demonstrated the first bilayer heterojunction cell in 1986. See C. W. Tang, *Applied Physics Letters* 48, 183 (1986). The copper phthalocyanine (CuPc)/3,4,9,10-perylenetetracarboxylic bis-benzimidazole (PTCBI)/Ag planar heterojunction system has exhibited a peak power conversion efficiency of $(1.1\pm0.1)\%$ since its first demonstration. See P. Peumans, V. Bulovic, and S. R. Forrest, *Applied Physics Letters* 76, 2650 (2000). Only recently has this material system broken the 1% barrier, achieving a power conversion efficiency of $(2.7\pm0.1)\%$ with the use of a bulk heterojunction structure grown via organic vapor phase deposition (OVPD). See F. Yang, M. Shtein, and S. R. Forrest, *Nature Mater.* 4, 37 (2005).

Similar devices based on the CuPc/$C_{60}$ system have resulted in single cell efficiencies up to $(5.0\pm0.3)\%$. See P. Peumans and S. R. Forrest, *Applied Physics Letters* 79, 126 (2001); J. Xue, S. Uchida, B. P. Rand, and S. R. Forrest, *Applied Physics Letters* 84, 3013 (2004); S. Uchida, J. Xue, B. P. Rand, and S. R. Forrest, *Applied Physics Letters* 84, 4218 (2004); and J. Xue, B. P. Rand, S. Uchida, and S. R. Forrest, *Adv. Mater.* 17, 66 (2005).

Previous work investigated the purity dependence of solar cell performance using zinc phthalocyanines as donor materials. See J. B. Whitlock, P. Panayotatos, G. D. Sharma, M. D. Cox, R. R. Sauers, G. R. Bird, *Opt. Eng.* 32, 1921 (1993); and D. Wohrle, L. Kreienhoop, G. Schnurpfeil, J. Elbe, B. Tennigkeit, S. Hiller, and D. Schlettwein, *J. Mater. Chem.* 5, 1819 (1995). Here, we find the performance of a CuPc-based thin film cell is impacted by materials purity. Specifically, we find that the cell responsivity and fill factor increase with hole mobility, which is found in turn to depend on material purity as assessed using mass spectrometry and Fourier transform infrared spectroscopy (FTIR). In particular, double heterojunction cells employing the highly purified CuPc-PTCBI material system show a peak power conversion efficiency of $(1.4\pm0.1)\%$ (under simulated AM 1.5G 1 sun intensity illumination) compared to less than 0.3% for unpurified CuPc source material. This study provides a clear linkage between organic material purity, charge transport properties, and device performance.

Two different source batches of CuPc were compared: the "unpurified" batch was commercially obtained (stock number: 43650, lot number: E17L30, Alfa Aesar, 26 Parkridge Rd., Ward Hill, Mass. 01835 USA), and was quoted by the manufacturer as 98% pure by mass; whereas the "purified" batch was refined by a single step thermal gradient purification process (see S. R. Forrest, *Chemical Reviews* 97, 1793 (1997)). Here, the material was heated under a pressure of $\leq 10^{-6}$ Torr for four to six days in a three zone furnace, each zone having a length of 20 centimeters. The temperature of the first zone was 415° C., the second was 360° C., and the third was 320° C. Purified material was obtained from the second zone. Source materials were loaded into a high vacuum thermal evaporation chamber with a base pressure of $5 \times 10^{-7}$ Torr, leading to a growth pressure of $1 \times 10^{-6}$ Torr for purified and $1 \times 10^{-5}$ Torr for unpurified material at a deposition rate of 2 Å/s. When not under high vacuum, the sources were stored under a nitrogen atmosphere, with water and oxygen levels below 1 ppm. Purified material was also grown by ultra high vacuum organic molecular beam deposition (OMBD) at a base pressure of $5 \times 11^{-10}$ Torr, and growth pressure of $1 \times 10^{-9}$ Torr. See S. R. Forrest, *Chemical Reviews* 97, 1793 (1997).

Glass substrates coated with a 1500 Å thick indium tin oxide (ITO) anode having a sheet resistance of 15Ω/□ were cleaned with detergent in deionized water, followed by a rinse in deionized water, sonication in 2-propanol, 5 minutes in boiling trichloroethylene performed twice, 5 minutes sonication in acetone performed twice, 5 minutes in boiling 2-propanol performed twice, and 5 minutes exposure to an ultraviolet-ozone surface treatment. The double heterojunction solar cell structure was 200 Å CuPc/250 Å PTCBI/100 Å bathocuproine (BCP)/Ag. Both PTCBI and BCP were purified prior to thermal deposition via a standard thermal gradient sublimation process. See S. R. Forrest, *Chemical Reviews* 97, 1793 (1997).

A single vacuum break during growth was necessary to attach a shadow mask in the purified nitrogen environment prior to patterned Ag cathode deposition. For space-charge-limited current (SCLC) measurements, CuPc films varying from 1000 Å to 8000 Å thickness were also grown on similarly prepared ITO-coated glass substrates forming an ITO/CuPc/Au structure. As in the case of the photovoltaic cell film growth, a single vacuum break and exposure to air after CuPc deposition was necessary to attach the shadow mask prior to Au cathode deposition.

The source material in the unpurified boat was not changed throughout this study. Successive film growths, therefore, result in purification of the unpurified material. Solar cell structures and those used for the SCLC measurements were alternately grown to enable measurement at different points in the growth timeline, thereby revealing the characteristics of films with increasing purity. Over the same time period, purified CuPc was also used to grow multiple solar cells and films for SCLC measurements, and these measurements showed consistency, within experimental error.

Current-voltage measurements were obtained at room temperature using a semiconductor parameter analyzer. For comparison with previous work on this "standard" device, and unless otherwise noted, solar cell performance was characterized in the dark and under simulated AM1.5G solar illumination using a 150 W Xenon arc lamp (Oriel Instruments, 150 Long Beach Blvd., Stratford, Conn. 06615 USA). The cell diameter was 1 mm as defined by the shadow mask openings. In addition, to obtain a more accurate measurement of the absolute power efficiency, in some experiments we included the spectral mismatch of our source and the solar spectrum using a Si reference cell traceable to National Renewable Energy Laboratory standards (PV Measurements, Inc., 1800 30$^{th}$ Street, #216, Boulder, Colo. 80301 USA; ASTM International Standard Test Method E 973-02; and K. Emery, *IEEE Transactions on Electron Devices* 46, 1928 (1999)). For SCLC measurements, the device diameter varied from 0.33 mm to 0.5 mm. Materials purity was assessed using X-ray photoelectron spectroscopy (XPS) of 300 Å thick CuPc films deposited under high vacuum on Ag-coated Si substrates. Additionally, mass spectra of the source powders employed a laser desorption ionization time-of-flight Hewlett-Packard G2025A mass spectrometer, and FTIR was carried out on 750 Å thick films deposited on KBr substrates.

Figure 13:
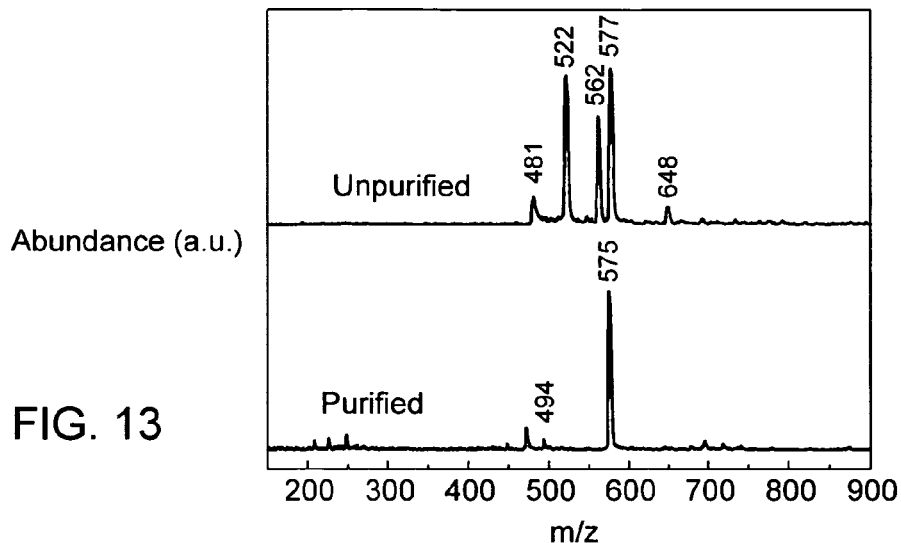
FIG. 13 illustrates the mass spectra for both purified and unpurified copper phthalocyanine (CuPc). The peak at 522 amu suggests that $H_2Pc$ is the principle impurity in CuPc.

Previous investigations into the purity of metallophthalocyanines have found that purity depends on different preparation methods, manufacturers and batches. See J. A. Thompson, K. Murata, D. C. Miller, J. L. Stanton, W. E. Broderick, B. M. Hoffman, and J. A. Ibers, *Inorganic Chemistry* 32, 3546 (1993). Principle impurities are typically phthalocyanines other than that which was being studied: i.e., the metal-free phthalocyanine ($H_2Pc$), or different metal-substituted phthalocyanine mixed with the particular compound of interest. See J. A. Thompson, K. Murata, D. C. Miller, J. L. Stanton, W. E. Broderick, B. M. Hoffman; and J. A. Ibers, *Inorganic Chemistry* 32, 3546 (1993); and T. G. Abdel-Malik and G. A. Cox, *Journal of Physical Chemistry* 10, 63 (1977). Low-resolution mass spectra of unpurified and purified source powders are shown in FIG. 13. All unlabeled peaks in the figure are assigned to residue from sinapinic acid used in some runs as a matrix. The unpurified CuPc sample shows several peaks not present in the purified sample. The largest peak at 522 amu is assigned to $H_2Pc$. The intensity of the $H_2Pc$ peak suggests that it is the most abundant impurity present in the unpurified source material. The mass of metal-free phthalocyanine is 514 amu, which differs somewhat from that measured, possibly due to the low resolution of the spectrometer. The peak at 561 amu is tentatively assigned to CuPc lacking a single amine group, and that at 648 amu may be a form of CuPc that is coordinated to an extra Cu atom.

Figure 14:
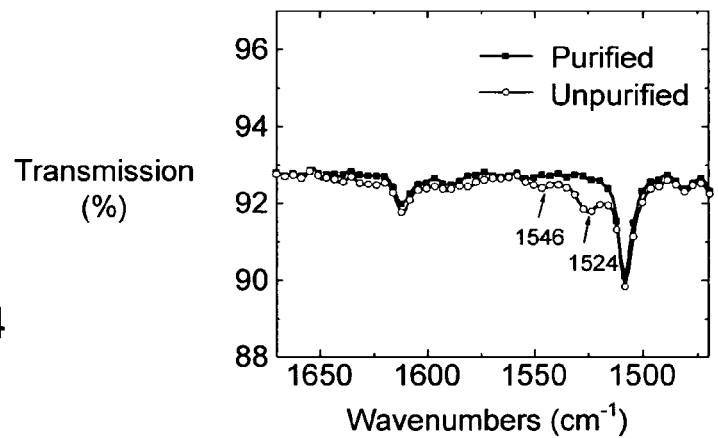
FIG. 14 illustrates the Fourier transform infrared (FTIR) spectra for both purified and unpurified copper phthalocyanine (CuPc). The differences in the FTIR data suggests that $H_2Pc$ is the principle impurity in CuPc.

Both purified and unpurified CuPc films exhibited nearly indistinguishable FTIR spectra, except in the region between 1515 and 1554 cm$^{-1}$ where two peaks are detected for the unpurified sample, FIG. 14. While a spectrum for CuPc shows no peaks in this region, that for $H_2Pc$ has a small peak near 1540 cm$^{-1}$ (see C. J. Pouchert, The Aldrich Library of FT-IR Spectra, 2$^{nd}$ ed., Aldrich, Milwaukee, 1997, Vol. 3, pp. 4181-4184), providing further evidence to support the presence of the metal-free phthalocyanine as the principle impurity.

The XPS spectra for both source materials are nearly identical. Five peaks are obtained: a C 1s peak at a binding energy of 285 eV, N 1s at 399 eV, Cu Auger at 571 eV, Cu 2p3 at 936 eV, and Cu 2p1 at 956 eV. The relative height of impurity peaks in mass spectra and the low yield of the purification process (<50%) indicate that if the impurities contained elements different from those in CuPc, they would be present in concentrations above the detection limit of XPS. Hence, we conclude that the impurities are the results of incomplete reactions in the production of CuPc, and are primarily composed of the same elements as CuPc.

To investigate the electrical effects of the impurities, we extracted mobilities for the purified and unpurified materials by fitting the current-voltage characteristics of ITO/CuPc/Au samples to Child's Law:

$$J = \frac{9}{8} \varepsilon_r \varepsilon_o \mu \frac{V^2}{d^3}$$

with a field-dependant hole mobility of it $\mu = \mu_o \exp(\gamma E^{1/2})$. Here J is the current density, $\in_r = 3.6$ is the relative permittivity of CuPc (see R. D. Gould, *Journal of Physics D* 19, 1785 (1986)), $\in_o$ is the permittivity of vacuum, V is the applied voltage, d is the film thickness, $\mu_o$ is the zero-field mobility, and γ is its characteristic field dependence. See W. D. Gill, *Journal of Applied Physics* 43, 5033 (1972); and D. H. Dunlap, P. E. Parris, and V. M. Kenkre, *Physics Review Letters* 77, 542 (1996). The J-V characteristics were fit in the region where average electric field was <$10^5$ V/cm to limit the effects of sample heating and material breakdown. Previous CuPc hole mobility measurements are typically obtained in-plane, and hence normal to the growth direction, whereas the current measurements analyzed here are parallel to the growth direction, consistent with the transport direction in thin film solar cells.

Figure 15:
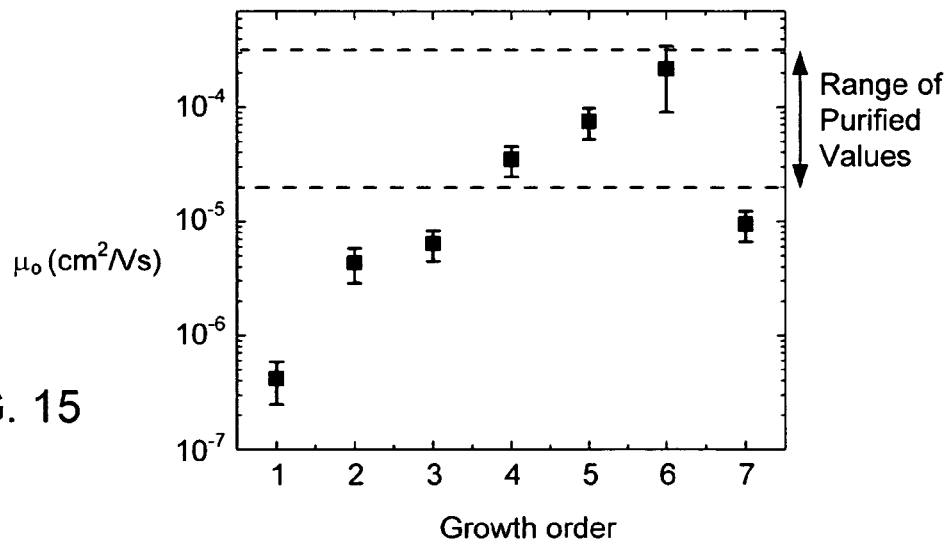
FIG. 15 illustrates zero-field mobility, $\mu_o$, as a function of order in the growth sequence for originally unpurified copper phthalocyanine (CuPc) source material. Measurements were made for film thicknesses ranging from 1000 Å to 4000 Å, and sandwiched between an indium-tin-oxide anode and Au cathode. The dotted lines delineate the range of values measured for $\mu_o$ of purified CuPc thin films.

The zero-field mobility, $\mu_o$, found for purified CuPc films deposited in high vacuum, ranged from $2\times10^{-5}$ to $3\times10^{-4}$ cm$^2$/Vs. Literature values for the hole mobility of CuPc measured via time-of-flight and field-effect methods vary widely (see R. D. Gould, *Journal of Physics D* 19, 1785 (1986); K. Xiao, Y. Q. Liu, G. Yu, and D. B. Zhu, *Synth. Met.* 137, 991 (2003); M. Kitamura, T. Imada, S. Kako, and Y. Arakawa, *Japan Journal of Applied Physics* 43, 2326 (2004); and K. Kudo, T. Sumimoto, K. Hiraga, S. Kuniyoshi, and K. Tanaka, *Japan Journal of Applied Physics* 36, 6994 (1997)), from $10^{-7}$ to $10^{-2}$ cm$^2$/Vs, indicating a strong dependence on sample preparation conditions (see R. D. Gould, *Journal of Physics D* 19, 1785 (1986)) and exposure to oxygen (see K. Kudo, T. Sumimoto, K. Hiraga, S. Kuniyoshi, and K. Tanaka, *Japan Journal of Applied Physics* 36, 6994 (1997)), among other factors. As shown in FIG. 15, $\mu_o$ obtained for the unpurified material for each successive growth run climbs by three orders of magnitude, from $4.2\times10^{-7}$ cm$^2$/Vs to $1.8\times10^{-4}$ cm$^2$/Vs, the latter value within the range measured for the purified material (shown as dotted lines in FIG. 15). By the 7$^{th}$ evaporation cycle, $\mu_o$ falls off due to the evaporation of less-volatile impurities when the boat temperature is increased to maintain a growth rate of 2 Å/s as it empties. From these measurements we conclude that changes in mobility can be directly correlated with material purity, which improves with each evaporation cycle.

Figure 16:
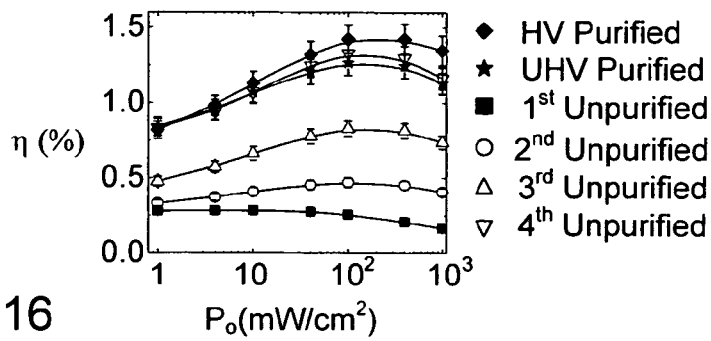
FIGS. 16, 17, and 18 are a comparison of average power conversion efficiency ($\eta$), fill factor (FF), and responsivity ($J_{sc}/P_o$) of four successive growths of solar cells using an originally unpurified copper phthalocyanine (CuPc) source deposited in high vacuum, purified source material deposited in high vacuum, and purified source material deposited in ultra-high vacuum. Filled squares represent the first deposition of the originally unpurified CuPc, open circles the second, open triangles the third run, open upside-down triangles the fourth run, filled diamonds the purified material grown in high vacuum, and filled stars the purified material grown in ultra high vacuum.
Figures 17, 18:
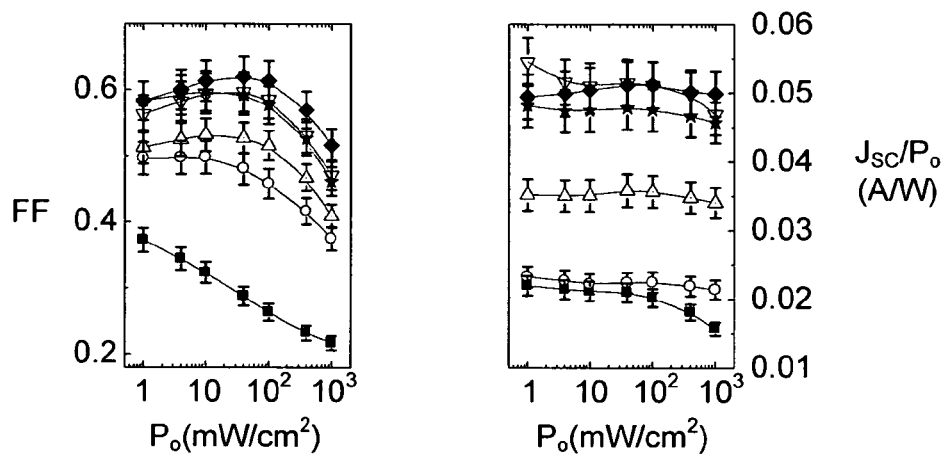

The impact of CuPc purity on solar cell performance was measured by comparing the power conversion efficiency and factors that affect efficiency at different points in the growth timeline, shown in FIGS. 16-18. Except for the first unpurified, highly-resistive device, the open circuit voltage showed little variation between different materials and different growths. At 1 sun, the value of the responsivity of the unpurified material increases from 0.020±0.001 A/W to 0.051±0.004 A/W, the latter near that obtained for the purified material deposited in both high and ultra high vacuum (0.050±0.003 A/W). Similarly, the fill factor significantly increases during successive growths of the originally unpurified material. At 1 sun illumination intensity, it progresses from 0.26±0.01, to 0.59±0.03; the latter value is comparable to that obtained for the purified material grown in both high and ultra high vacuum (0.59±0.05). At 1 sun, the unpurified power conversion efficiencies increase from (0.26±0.01)% to (1.3±0.1)% during 4 successive growth runs.

In comparison, the purified material has an average power conversion efficiency of (1.4±0.1)% when deposited in high vacuum, and (1.3±0.1)% in ultra high vacuum. These values show a significant improvement when compared with past work (see C. W. Tang, *Applied Physics Letters* 48, 183 (1986); and P. Peumans, V. Bulovic, and S. R. Forrest, *Applied Physics Letters* 76, 2650 (2000)) on CuPc/PTCBI cells, whose efficiencies consistently are in the range of (1.0±0.1)%. When spectral mismatch factor (Oriel Instruments, 150 Long Beach Blvd., Stratford, Conn. 06615 USA; and PV Measurements, Inc., 1800 30$^{th}$ Street, #216, Boulder, Colo. 80301 USA) corrections are made to compensate for the differences between the solar and simulated spectra, the 1.4% efficiency is decreased to (1.1±0.1)%. From these data, we conclude that the purity of the source material has a greater impact on device performance than chamber background or growth pressure.

Figure 19:
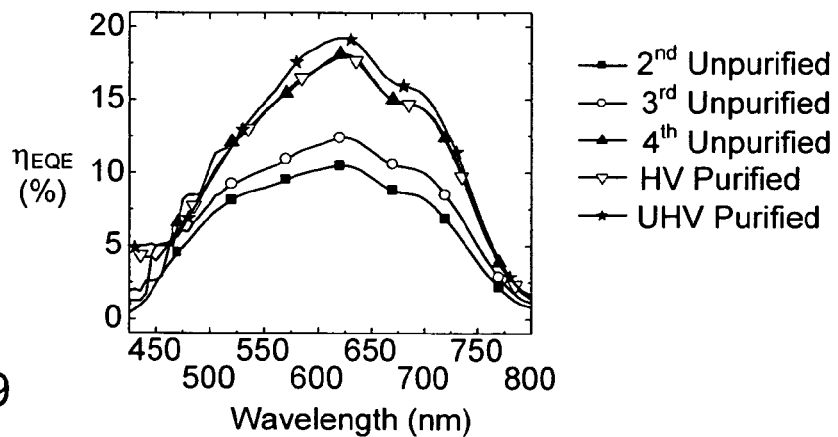
FIG. 19 is a comparison of average external quantum efficiency ($\eta_{EQE}$) of three successive growths of solar cells using unpurified source material in high vacuum, purified source material in high vacuum, and purified source material in ultra-high vacuum.

To verify that the CuPc is responsible for the enhancement in power conversion efficiency, the cell external quantum efficiency ($\eta_{EQE}$) was measured as shown in FIG. 19. Once again, we see a trend of increasing efficiency as the material is purified: the unpurified material starts with a peak $\eta_{EQE}$=10.5% at a wavelength of $\lambda$=625 nm, increasing to 18.1% at $\lambda$=625 nm for the last unpurified run, similar to values measured for the fully purified material. Both high vacuum and ultra high vacuum purified material have $\eta_{EQE} \geq 18\%$. The largest increase in external quantum efficiency occurs between $\lambda$=550 nm and 750 nm, corresponding to the peak absorption of CuPc. See P. Peumans, V. Bulovic, and S. R. Forrest, *Applied Physics Letters* 76, 2650 (2000). This indicates that the response due to absorption in the CuPc donor material is principally responsible for the increase in cell power conversion efficiency with material purity.

In conclusion, we have found that the purity of the organic small molecular weight material used in the active layers of solar cells strongly impacts the device performance. Mass and FTIR spectra used in conjunction with charge carrier mobility data suggest that impurities such as $H_2$Pc can significantly influence the electrical characteristics of vacuum deposited organic solar cells employing CuPc as the donor material. We have observed a trend of improving mobility as the source is purified during the growth process, which correspondingly leads to higher photovoltaic cell fill factors, responsivities, and power conversion efficiencies.

The example structures in our experiments were donor-acceptor bilayer heterojunctions. The improvement in performance to a bilayer device is directly applicable to bulk heterojunction devices, as the basic principles of operation are the same. Based upon past experience with mixed donor-acceptor heterojunction and Schottky devices, the improvements in mobility and absorption efficiency achieved through material purification are expected to result in performance improvements in mixed heterojunction and Schottky devices, relative to the performance of such architectures without purification.

As described above, organic photosensitive devices of the present invention may be used to generate electrical power from incident electromagnetic radiation (e.g., photovoltaic devices) or may be used to detect incident electromagnetic radiation (e.g., a photodetector or photoconductor cell).

Specific examples of the invention are illustrated and/or described herein. However, it will be appreciated that modifications and variations of the invention are covered by the above teachings without departing from the spirit and scope of the invention.

What is claimed is:

1. A method comprising,
   beginning with a first sample of an organic small molecule material, performing ordered steps of:
   (a) purifying the organic small molecule material by thermal gradient sublimation;
   (b) testing the purity of at least one sample from the purified organic small molecule material by spectroscopy; and
   (c) if the spectroscopic testing reveals any peaks exceeding a threshold percentage of a magnitude of a characteristic peak of a target organic small molecule, repeating steps (a) through (c) on the purified organic small molecule material,
   wherein the threshold percentage is no more than 10%, and steps (a) through (c) are performed at least twice.

2. The method of claim 1, wherein the threshold percentage is 5%.

3. The method of claim 2, wherein the threshold percentage is 2%.

4. The method of claim 1, wherein the threshold percentage is set based upon a spectra of an earlier-tested sample of the organic small molecule material.

5. The method of claim 1, further comprising, after no peaks remain that exceed the threshold percentage of the magnitude of the characteristic peak of the target small molecule:
(d) forming a photosensitive optoelectronic device comprising at least one donor-acceptor interface arranged between two electrodes, wherein a donor or an acceptor of the donor-acceptor interface includes purified organic small molecule material from the first sample.

6. The method of claim 5, wherein the threshold percentage is 5%.

7. The method of claim 6, wherein the threshold percentage is 2%.

8. The method of claim 1, further comprising forming a photosensitive optoelectronic device comprising at least one Schottky-barrier heterojunction including purified organic small molecule material from the first sample as a photoconductive material of the heterojunction.

9. The method of claim 1, further comprising, based on a cumulative repetition of steps (a) through (c), determining a total amount of thermal gradient sublimation that was required to purify the first sample;
purifying a second sample of the organic small molecule material by thermal gradient sublimation in accordance with said total amount.

10. The method of claim 9, wherein the first sample and the second sample are obtained from a same source.

11. The method of claim 9, further comprising, forming a photosensitive optoelectronic device comprising at least one donor-acceptor interface arranged between two electrodes, wherein a donor or an acceptor of the donor-acceptor interface includes purified organic small molecule material from the second sample.

12. The method of claim 9, further comprising forming a photosensitive optoelectronic device comprising at least one Schottky-barrier heterojunction including purified organic small molecule material from the second sample as a photoconductive material of the heterojunction.

13. The method of claim 1, further comprising:
prior to a first occurrence of step (a), determining an initial spectra of the first sample by spectroscopy;
based on a cumulative repetition of steps (a) through (c), determining a total amount of thermal gradient sublimation that was required to purify the first sample;
determining that an initial spectra of a second sample of the organic small molecule material by spectroscopy, using a same testing methodology as was used to determine the initial spectra of the first sample; and
purifying a second sample of the organic small molecule material by thermal gradient sublimation in accordance with said total amount, if the initial spectra of second sample substantially matches the initial spectra of the first sample.

14. The method of claim 13, further comprising, forming a photosensitive optoelectronic device comprising at least one donor-acceptor interface arranged between two electrodes, wherein a donor or an acceptor of the donor-acceptor interface includes purified organic small molecule material from the second sample.

15. The method of claim 13, further comprising forming a photosensitive optoelectronic device comprising at least one Schottky-barrier heterojunction including purified organic small molecule material from the second sample as a photoconductive material of the heterojunction.

16. The method of claim 1, wherein the spectroscopy is mass spectroscopy.

17. The method of claim 16, wherein step (b) comprises:
(b1) making a powder from a sample of the purified organic small molecule material;
(b2) performing mass spectroscopy on the powder.

18. The method of claim 17, wherein mass spectroscopy is performed by laser desorption ionization time-of-flight measurement.

19. The method of claim 1, wherein the spectroscopy is Fourier transform infrared spectroscopy.

20. The method of claim 19, wherein step (b) comprises:
(b1) depositing a sample of the purified organic small molecule material onto a substrate as a film;
(b2) performing Fourier transform infrared spectroscopy on the film.

21. The method of claim 1, wherein each occurrence of said (b) testing the purity of at least one sample includes:
testing a first sample of the purified organic small molecule material by mass spectroscopy; and
testing a second sample of the purified organic small molecule material by Fourier transform infrared spectroscopy,
wherein steps (a) through (c) are repeated if either test reveals any peaks exceeding the threshold percentage of the magnitude of the characteristic peak of the target organic small molecule.

22. The method of claim 21, wherein the threshold percentage is 5%.

23. The method of claim 22, wherein the threshold percentage is 2%.

* * * * *